(12) United States Patent
Fukunaga et al.

(10) Patent No.: US 7,582,943 B2
(45) Date of Patent: Sep. 1, 2009

(54) COLOR LIGHT RECEIVING DEVICE AND IMAGE PICKUP DEVICE

(75) Inventors: Toshiaki Fukunaga, Kanagawa (JP); Daisuke Yokoyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 735 days.

(21) Appl. No.: 11/142,499

(22) Filed: Jun. 2, 2005

(65) Prior Publication Data

US 2005/0270406 A1 Dec. 8, 2005

(30) Foreign Application Priority Data

Jun. 4, 2004 (JP) .............................. 2004-166800

(51) Int. Cl.
*H01L 31/00* (2006.01)
(52) U.S. Cl. ............................... 257/432; 257/E31.127
(58) Field of Classification Search ................. 257/215, 257/432–461, E31.127
See application file for complete search history.

(56) References Cited

U.S. PATENT DOCUMENTS

| 4,841,348 A * | 6/1989 | Shizukuishi et al. ........ 257/226 |
| 5,965,875 A | 10/1999 | Merrill |
| 2002/0190254 A1* | 12/2002 | Turner et al. ................... 257/59 |
| 2003/0197173 A1* | 10/2003 | Azumi ......................... 257/21 |
| 2003/0209651 A1 | 11/2003 | Iwasaki |
| 2004/0178466 A1* | 9/2004 | Merrill et al. ................ 257/440 |
| 2004/0178478 A1* | 9/2004 | Shizukuishi ................. 257/620 |
| 2006/0201546 A1* | 9/2006 | Yokoyama ................... 136/263 |
| 2007/0057339 A1* | 3/2007 | Mitsui et al. ................ 257/432 |

FOREIGN PATENT DOCUMENTS

| JP | A 7-38136 | 2/1995 |
| JP | A 2003-332551 | 11/2003 |

* cited by examiner

*Primary Examiner*—Nathan W Ha
(74) *Attorney, Agent, or Firm*—Margaret A. Burke; Sheldon J. Moss

(57) ABSTRACT

The invention provides a light receiving device having a single semiconductor substrate and a short-wavelength light receiving section. The single semiconductor substrate has regions of a first conductivity type and regions of a second (opposite) conductivity type alternately multiply laminated. Each of junction surfaces between the regions of the first conductivity type and the regions of the second conductivity type is formed to have a depth which enables converting light in a wavelength band, which is different from light in other wavelength bands converted by other junction surfaces, to electricity. The short-wavelength light receiving section is provided on or above the incident light surface of the semiconductor substrate and detects light having a wavelength shorter than the central wavelengths of all the respective wavelength bands converted by the junction surfaces. The invention further provides an image pickup device which uses an array of a plurality of the light receiving device.

14 Claims, 8 Drawing Sheets

COLOR LIGHT RECEIVING DEVICE AND IMAGE PICKUP DEVICE

CROSS-REFERENCE TO RELATED APPLICATION

This application claims priority under 35 USC 119 from Japanese Patent Application No. 2004-166800, the disclosure of which is incorporated by reference herein.

BACKGROUND OF THE INVENTION

1. Field of the Invention

The present invention relates to a color light receiving device and an image pickup device.

2. Description of the Related Art

As conventional light receiving devices, metal oxide semiconductor (MOS) capacitors and pn junction diodes made of semiconductors such as crystalline silicon, amorphous silicon, GaAs, or the like, are generally used. These light receiving devices can also be utilized as photoelectric conversion sections in image pickup devices, such as charge coupled devices (CCD) and complementary metal oxide semiconductors (CMOS). Although CCD and CMOS sensors are different from each other in signal reading-out method, however, for either image pickup device, a light receiving device having the same configuration can generally be used. Such an image pickup device is used for a variety of applications, including image cameras, copying machines, and facsimile machines.

However, conventional light receiving devices have had only the function to convert the intensity of light to an electric signal, having no ability to detect any particular color. For this a single-plate method is used. This method provides a color signal by covering individual photosensors with a monochromatic color filter, and combining the signal from a photosensor with those from adjacent photosensors, which are dedicated to other colors. As colors of the color filters, red (hereafter, may be expressed as R), green (hereafter, may be expressed as G), and blue (hereafter, may be expressed as B) are used as the three primary colors of light. Or, as complementary colors thereof, cyan (hereafter, may be expressed as C), magenta (hereafter, may be expressed as M), and yellow (hereafter, may be expressed as Y) are used. The method which adds green, having a wide visible region, to the three complementary colors to provide 4 colors has also been proposed.

For high image quality applications, a multiplate method, which separates a color image with a color separation prism and uses three or four image pickup devices, is employed. In an example, after the incident light is color-separated with a prism, the R, G, B three colors are sensed by respective photosensors. Further, a four-plate method, which adopts two photosensors for G in order to enhance the resolution, is also known.

However, the single-plate method has several problems.

A first of the problems is that a part of the light is absorbed by the color filter, resulting in the sensitivity being lowered. Especially, when the light is passed through a red color filter, the blue color and the green color are lost in the color filter, and thus only one third of the light is utilized at most.

A second of the problems is that, because the RGB three colors are detected in different locations, color separation is caused, and false color tends to be produced. Especially, false color tends to occur at the boundary between light and shade of the subject, and the false color can cause a moire phenomenon. To avoid the problem of such a false color or a moire phenomenon, an optical low-pass filter is used, however, the optical low-pass filter lowers the resolution. With an optical low-pass filter, the thinner the filter the lower the reduction in resolution will be, however, the effectiveness is also lowered, and thus reciprocal characteristics are exhibited.

The multiplate method also presents problems. The multiplate method requires a high precision prism and a color separation film (a dichroic mirror), and requires a highly accurate alignment technique to be used, which results in the cost and the size of the apparatus being increased. In addition, the loss of light in the prism and other optical elements is also a critical problem.

In order to eliminate such a false color problem, a configuration of a laminated type image sensor has been proposed (for example, refer to U.S. Pat. No. 5,965,875 and Japanese Patent Application Laid-Open (JP-A) No. 7-38136). If light receiving devices having sensitivity to different colors can be laminated, the light can be separated into respective colors in the same (planar) location, thus the problem of false color due to the difference in light receiving location can be avoided. With such a configuration, the low-pass filter is theoretically not needed.

The laminated type image sensor proposed comprises laminated light receiving sections, having a configuration in which the wavelength dependency of the absorption factor of Si is utilized for color separation in the direction of the depth thereof. This image pickup device is effective against a false color. However, this image pickup device carries out color separation on the basis of the depth of light entering into the Si, thus the spectral range detected by the respective light receiving sections is broad, which has resulted in insufficient color separation. This causes reduction in the amount of light converted to a signal in practice, with the sensitivity being lowered. In addition, there occurs a problem that, although a certain degree of color separation can be provided by design of the depth of the P-N junction in the respective light receiving sections, the design involves a trade-off relationship between the sensitivity and the color separation. That is if the color separation is enhanced, the sensitivity is decreased, for example. Therefore, this design has inherent limitations.

Color separation by the laminated type image sensor is insufficiently performed especially between blue and green colors. To solve this problem, a method which provides a green color sensor on or above the top of the Si substrate has been proposed (for example, refer to JP-A No. 2003-332551).

Therefore, there is a need in the art for a laminated type image sensor which generates no false colors, is an excellent light receiving device, and a provides enhanced sensitivity and color separation.

SUMMARY OF THE INVENTION

The present invention provides a light receiving device having a high color separation capability, and an image pickup device using the light receiving device.

In the process of developing a laminated type image sensor, it has been revealed that the dependency on the surface state is an extremely important consideration. The substrate surface has surplus donors, acceptors, traps, or the like resulting from contamination, imperfections of a crystal, or the like, which generate undesirable localized energy levels. With a laminated type image sensor, the blue color on the shorter-wavelength side, is sensed at the silicon substrate front surface. However, since this blue color light receiving section is at a shallow depth from the substrate front surface, it has been found that the blue color light receiving section is greatly affected by the surface state. This results in a blue color signal having excessive noise.

By receiving light of different colors in the same (planar) location, the problem of false color has been solved. In addition, by separately providing a short-wavelength light receiving section (such as a blue color sensor) on the light entering side such that a high color separation capability is exhibited without the sensitivity for the short-wavelength light receiving region (mainly blue color) being lowered, it is possible to avoid the influence of the surface state.

Namely, the present invention provides a light receiving device comprising a single semiconductor substrate and a short-wavelength light receiving section provided on or above a surface of a light entering side of the semiconductor substrate, wherein: the single semiconductor substrate comprises regions of a first conductivity type and regions of a second conductivity type in an alternately multiply laminated manner, wherein the second conductivity type is a conductivity type opposite to the first conductivity type; each of junction surfaces between the regions of the first conductivity type and the regions of the second conductivity type is formed to have a depth which enables converting light in a wavelength band, which is different from light in other wavelength band(s) converted by other junction surfaces, to electricity; and the short-wavelength light receiving section detects light having a wavelength shorter than the central wavelength(s) of all the respective wavelength bands converted by the junction surfaces.

The present invention further provides an image pickup device in which a plurality of the light receiving devices are arranged.

The image pickup device of the present invention is applicable to digital cameras, video cameras, facsimile machines, scanners, copying machines, X-ray image sensors, and any other apparatuses using an image pickup device. In addition, the light receiving device of the present invention is applicable to bio-sensors, chemical sensors, and any other optical sensors.

BRIEF DESCRIPTION OF THE DRAWINGS

FIGS. 10A-11D are schematic drawings illustrating the production process for the third short-wavelength light receiving section.

DETAILED DESCRIPTION OF THE INVENTION

The present invention provides an image sensor having a laminated type structure, and being capable of detecting respective colors in the same planar location. Therefore, firstly the present invention provides an effect of no false color being generated. False color is a false signal occurring in an image component having a spatial frequency higher than the Nyquist frequency being returned in the region lower than the Nyquist frequency, which is called an aliased signal. If an image is constructed from a signal which is has a large amount of aliasing, a so-called moire phenomenon occurs.

Secondly, the present invention allows a large area to be provided for the light receiving section, which permits realization of an image pickup device having a high resolution and a high aperture ratio. In other words, if an image pickup device is manufactured with a given precision, it can acquire a higher definition image.

When a conventional color filter is used, three sub-pixels, R, B, G, constitute a single pixel, thus when sub-pixels of the same size are used, the size of a single pixel is increased in proportion to the number of colors (which is three for R, B, G, for example).

Thirdly, use of the present invention eliminates the need for using a color filter or an optical low-pass filter and other optical parts.

The present invention has a further feature that a short-wavelength light receiving section is disposed outside the semiconductor substrate. The short-wavelength light receiving section detects light having a wavelength shorter than the central wavelengths of the light received by the laminated structure. Particularly, when the short-wavelength light receiving section is to be made of an organic material, an organic material is used in which the quantum efficiency curve has a maximum value in the frequency range of 420 to 480 nm. When the short-wavelength light receiving section is to be made of an inorganic semiconductor, an inorganic semiconductor which has a band gap in the range from 420 to 480 nm, i.e., it is sensitive to blue, is used.

Fourthly, by having a laminated structure in which such a short-wavelength light receiving section is disposed, the present invention allows the blue noise due to the surface state to be reduced, and the sensitivity and the color separation capability to be enhanced.

Fifthly, unlike the multi-plate method image pickup system, only one image pickup device is required, and the need to use a high precision color separation prism, a dichroic mirror, and the like is eliminated, thus the present invention is compact and minimizes cost.

Hereinafter, the light receiving device and the image pickup device of the present invention will be described in detail.

Light Receiving Device (1) Outline of Light Receiving Device of the Present Invention The light receiving device of the present invention can utilize the photoconductive effect and the photovoltaic effect. Configurations of light receiving devices of the present invention include photoconductive type, p-n junction type, Schottky junction type, PIN junction type, MSN (metal-semiconductor-metal) type, and a phototransistor type.

The present invention uses a light receiving device, wherein a region of a first conductivity type and a region of a second conductivity type, which is a conductivity type opposite to the first conductivity type, are alternately multiply laminated in a single semiconductor substrate. The respective junction surfaces of the region of the first conductivity type and the region of the second conductivity type are formed at appropriate depths to enable photoelectric conversion of most of the light in a plurality of different wavelength bands. As a single semiconductor substrate, a single crystalline silicon substrate is preferable; it allows color separation utilizing the absorption wavelength characteristics which depends upon the depth of the silicon substrate.

Further, with the present invention, a short-wavelength light receiving section, which detects light having a wavelength shorter than the central wavelength of the respective wavelength bands, is provided outside the semiconductor substrate. The short-wavelength light receiving section is preferably a blue color sensor. When the short-wavelength light receiving section is to be made of an organic material, the quantum efficiency curve has preferably a maximum value in the frequency range of 400 to 500 nm, and more preferably in the range 420 to 480 nm. When the short-wavelength light receiving section is to be made of an inorganic semiconductor, the band gap preferably has a range from 400 to 500 nm in frequency, and more preferably in the range from 420 to 480 nm.

(2) Short-Wavelength Light Receiving Section

The short-wavelength light receiving section may be made of either an organic material or an inorganic semiconductor. However, organic materials are poor in thermal stability, and difficult to process for device formation, thus it is preferable that the short-wavelength light receiving section be made of an inorganic semiconductor.

The inorganic semiconductor of which the short-wavelength light receiving section is to be made is not particularly limited. Preferable examples thereof include InGaN-based, InAlN-based, InAlP-based, and InGaAlP-based inorganic semiconductors.

The InGaN-based inorganic semiconductor is a material whose content of In is appropriately changed, i.e., is adjusted such that the maximum absorption value is given in the wavelength range for blue color. In other words, a composition of $In_xGa_{1-x}N$ ($0 \leq X < 1$) is provided. Such a compound semiconductor is manufactured by using the MOCVD (metallorganic chemical vapor deposition) method.

The InAlN-based semiconductor, which is a nitride semiconductor using Al, an element belonging to the same group 13 as Ga, can also be utilized as a short-wavelength light receiving section in the same manner as a GaN-based one.

InAlP and InGaAlP, which are lattice matched to the GaAs substrate, can also be used.

An inorganic semiconductor constituting a short-wavelength light receiving section may be provided as an embedded structure. Embedded structure refers to a configuration in which both ends of the short-wavelength light receiving section are covered with a semiconductor which is different from the short-wavelength light receiving section semiconductor. The semiconductor covering both ends is preferably a semiconductor having a band gap wavelength shorter than or equivalent to the band gap wavelength for the short-wavelength light receiving section.

In the short-wavelength light receiving section applied, the absorption factor for short-wavelength light (particularly, light having a wavelength of 420 to 480 nm equivalent to a blue color) is preferably 60% or higher, and more preferably, 90% or higher. The remaining short-wavelength light which has passed without being absorbed reaches a silicon substrate described later, and the portion of the silicon substrate that senses a green color also senses the blue color. Therefore, when the absorption factor for short-wavelength light in the short-wavelength light receiving section, which is provided on or above the silicon substrate, is previously known, the intensity of the short-wavelength light can be corrected by computation.

The thickness of the short-wavelength light receiving section depends upon the absorption factor, and is preferably 0.3 μm to 1.5 μm, and is more preferably 0.5 μm to 1 μm.

When the short-wavelength light receiving section is to be made of an organic material, coumarin 6 can be used as a blue-light absorbing coloring matter. For example, polysilane, a transparent conductive polymer, in which coumarin 6 is dispersed is used, and a film (hereafter, expressed as coumarin 6/polysilane film) is formed. The coumarin 6/polysilane film can be formed on a glass substrate with ITO (indium tin oxide) electrodes. A coumarin 6/polysilane film on which a semitransparent aluminum electrode is formed can be used as a short-wavelength light receiving section.

The short-wavelength light receiving section may be connected, in any form, to a light receiving section described below that performs color separation between green and red in the semiconductor substrate, however, an electrode is provided therebetween. The electrode material is not particularly limited, provided that it is a conductor. Preferable examples thereof include Al, Cu, Ti, Au, Pt, Ag, Cr, and other metallic materials, and polysilicone, silicide, indium tin oxide (ITO), ZnO, $SnO_2$ and other inorganic materials. Preferable examples thereof further include conductive polymers represented by highly doped polypyridine, polyacetylene, polyaniline, polypyrrole, and polythiophene; conductive inks in which carbon particles, silver particles, or the like are dispersed; and the like.

In order to electrically insulate between the short-wavelength light receiving section and the semiconductor substrate, an insulating layer is preferably provided. Further, the short-wavelength light receiving section and the semiconductor substrate may be provided with a separation between each other.

The short-wavelength light receiving section is disposed, being sandwiched by electrodes on both sides. From one electrode, a blue color light signal is extracted, and the other electrode is connected to the bias electrode. Transparent electrodes are used so that the light which has passed through the short-wavelength light receiving section can reach the light receiving section which performs color separation between green and red.

Hereinafter, preferable embodiments of the short-wavelength light receiving section of the present invention will be described in detail with reference to the attached drawings.

1) First Embodiment of Short-Wavelength Light Receiving Section

Figure 1:
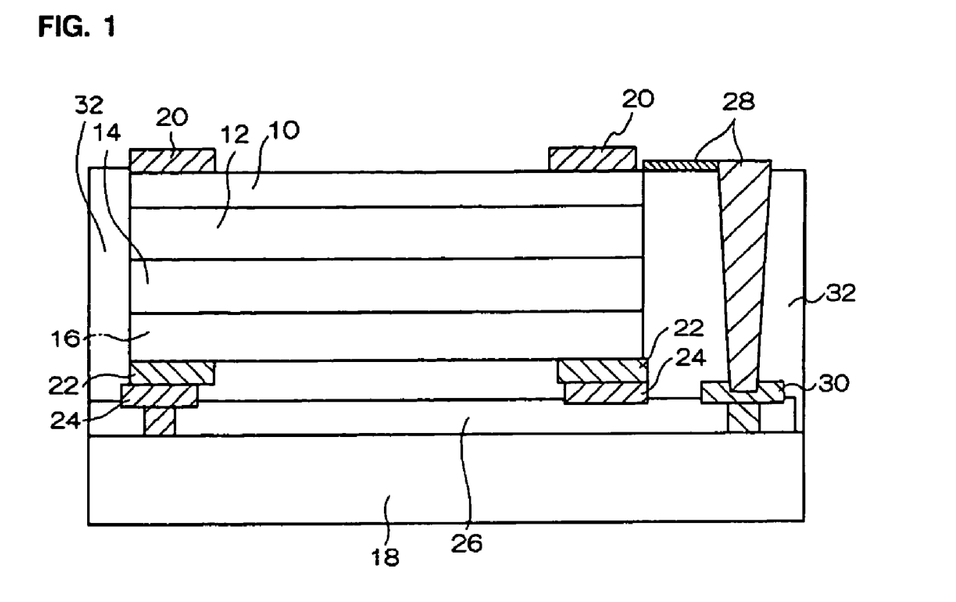
FIG. 1 is a sectional view illustrating the configuration of a first short-wavelength light receiving section.

FIG. 1 shows a short-wavelength light receiving section essentially consisting of an InGaN-based semiconductor.

A p-GaN contact layer (10), a p-InGaN layer (12), an n-InGaN layer (14), and an n-GaN contact layer (16) are laminated in this order, with an n-side electrode (22) being provided on the surface of the n-GaN contact layer (16), and a p-side electrode (20) on the surface of the p-GaN contact layer (10). The n-side electrode (22) is jointed to a solder joint (24) which is formed on an Si signal transfer circuit board semiconductor substrate (18), and the p-side electrode (20)

and an electrode (30) for jointing to an Si-signal transfer circuit board semiconductor substrate (18) are connected to each other by electric wiring (28) formed in an insulating film (32) thereon. Between the Si-signal transfer circuit board (18) and the n-side electrode (22), a transparent insulating film (26) is provided.

2) Second Embodiment of Short-Wavelength Light Receiving Section

Figure 2:
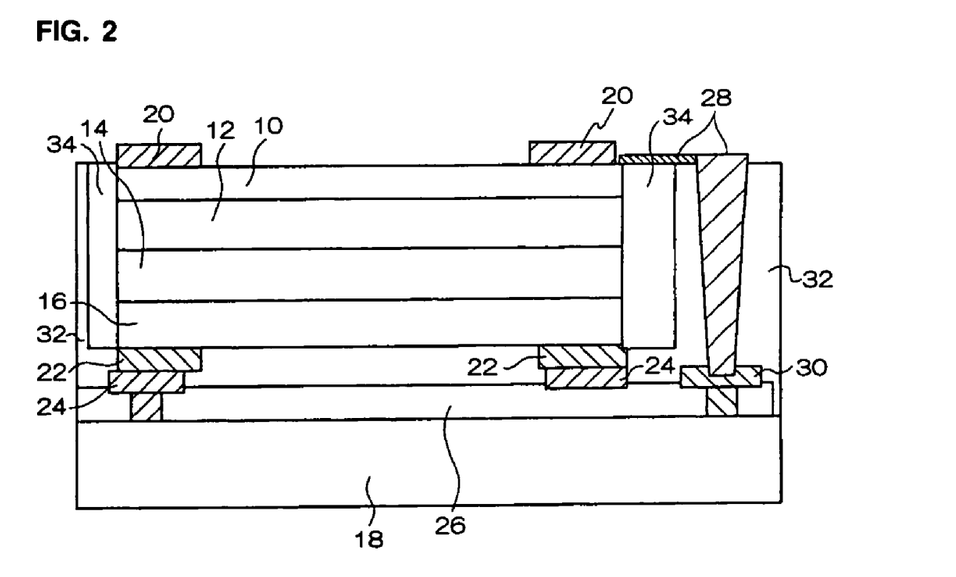
FIG. 2 is a sectional view illustrating the configuration of a second short-wavelength light receiving section.

FIG. 2 shows an embodiment in which a GaN embedding layer (34) is formed around the InGaN light receiving section. This embodiment is similar to the first embodiment of the short-wavelength light receiving section, except that an embedding layer is formed.

3) Third Embodiment of Short-Wavelength Light Receiving Section

Figure 3:
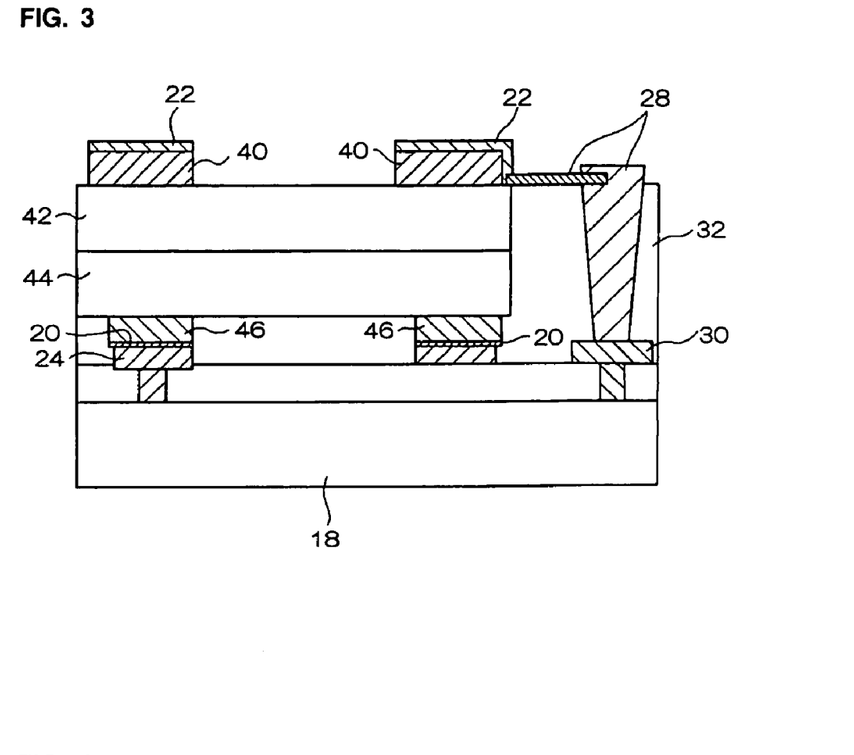
FIG. 3 is a sectional view illustrating the configuration of a third short-wavelength light receiving section.

FIG. 3 shows an embodiment in which a short-wavelength light receiving section is configured with an InAlP semiconductor which is lattice matched to the GaAs.

A p-InAlP layer (44) and an n-InAlP layer (42) are laminated. A p-GaAs contact (46) is disposed on the side of the p-InAlP layer (44), and is joined to a solder joint (24) formed on an Si circuit board by a p-side electrode (20). An n-GaAs contact (40) is disposed on the side of the n-InAlP layer (42), and is joined to an Si signal transfer circuit board (18) by electric wiring (28), formed in an insulating film (32) thereon, via an n-side electrode (22).

4) Fourth Embodiment of Short-Wavelength Light Receiving Section

Figure 4:
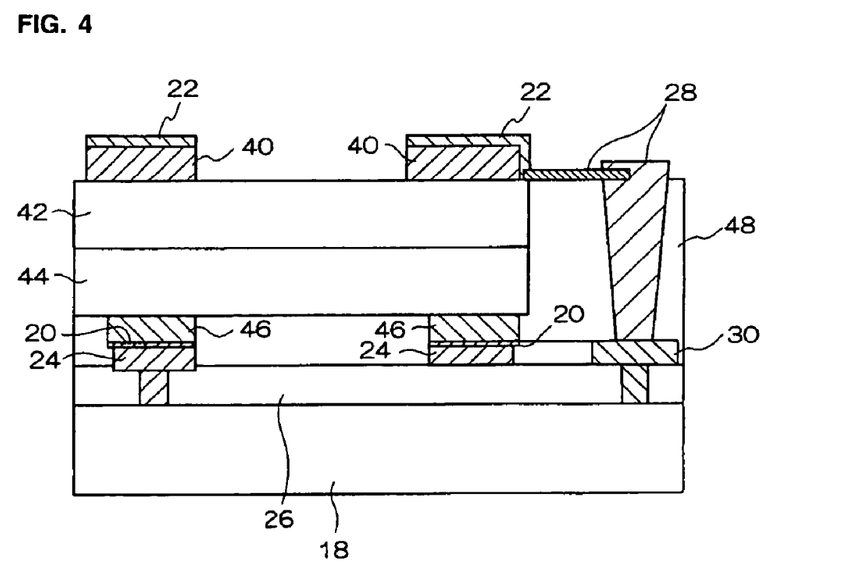
FIG. 4 is a sectional view illustrating the configuration of a fourth short-wavelength light receiving section.

FIG. 4 shows an embodiment in which an InAlP embedding layer (48) is provided for the above third embodiment of the short-wavelength light receiving section. This embodiment is similar to the third embodiment of the short-wavelength light receiving section, except that an embedding layer is further formed.

(3) Semiconductor Substrate

The present invention provides a light receiving section which carries out color separation by utilizing the absorption wavelength characteristics which depend upon the depth of the pn junction surface which is formed in a single semiconductor substrate. As the semiconductor substrate, a silicon array which is arrayed at a high density can be used, but more preferably, a single crystalline silicon substrate may be used. When a silicon array which is arrayed at a high density is used, there is a need to avoid color mixture, thus a light exclusion film is required to be formed. By forming a transparent insulating film on the topmost surface on the light entering side with an aperture provided, and depositing metal, a light exclusion film is formed.

The longer the wavelength of the light which enters from the front surface is, the more deeply the light penetrates the silicon substrate. Accordingly, blue, green, and red colors are sensed in this order, in the order of the junction surfaces down from the surfaces which reside nearest to the light entering side. However, the light entering from the front surface is light which has passed through the above short-wavelength light receiving section, and 90% or more of the short-wavelength light (mainly blue color light) has already been eliminated. Some of the short-wavelength light that has passed without being absorbed is sensed at the junction surface that senses green.

It is preferable that the junction surface which has a green color light receiving section detects light having a wavelength of approximately 500 to 600 nm, and a junction surface which has a red color light receiving section detects light having a wavelength of approximately 600 nm or longer.

It is preferable that the junction structure be npn or pnpn, from the light entering side. In particular, by providing a p layer on the front surface to raise the surface potential, holes and electrons generated in the vicinity of the front surface can be trapped to reduce the dark current, thus it is more preferable to adopt a pnpn junction.

A pn photo diode having pnpn four layers is formed in the depth direction of the silicon substrate, by deep diffusion from the p-type silicon substrate front surface of an n-type layer, a p-type layer, an n-type layer, and a p-type layer, in this sequence. Because the light which enters the diode from the front surface side, having a longer wavelength, penetrates more deeply, the attenuation coefficients for each particular incident wavelengths are silicon characteristic values, the photo diode is designed such that the depths of the pn junction surfaces cover the respective wavelength bands (R, G) of visible light. Similarly, by forming an n-type layer, a p-type layer, and an n-type layer in this sequence, an npn three-layer diode is obtained. From the n-type layers, optical signals are taken out, and the p-type layers are connected to the ground.

Further, by providing a leading electrode for the respective regions, and applying a prescribed reset potential, the respective regions are depleted, and the capacity of the respective junctions is reduced to a minimum value. Thereby, the capacitance generated on the junction surfaces can be minimized.

(4) Other Components

In order to prevent the manufactured device from being contacted by oxygen, moisture, and the like, a protection layer or a sealing layer may be provided. Examples of the protection layer include a diamond thin film, a metal oxide, a metal nitride, and other inorganic material films; fluorine resin, polyparaxylene, polyethylene, silicone resin, polystyrene resin, and other polymer films; and further light curable resins and the like. In addition, glass, gas impermeable plastic, metal or the like can be used to cover the device section, and with an adequate sealing resin, the device itself can be packaged. In this case, a substance with a high water absorption may be contained in the package.

In order to avoid reception of infrared light in the laminated areas of the silicon substrate, it is preferably to provide an infrared cut filter.

Further, by forming a micro lens array above the top of the light receiving device, the lens condensing efficiency can be improved, thus such an embodiment is also preferable.

(5) Embodiments

Figure 5:
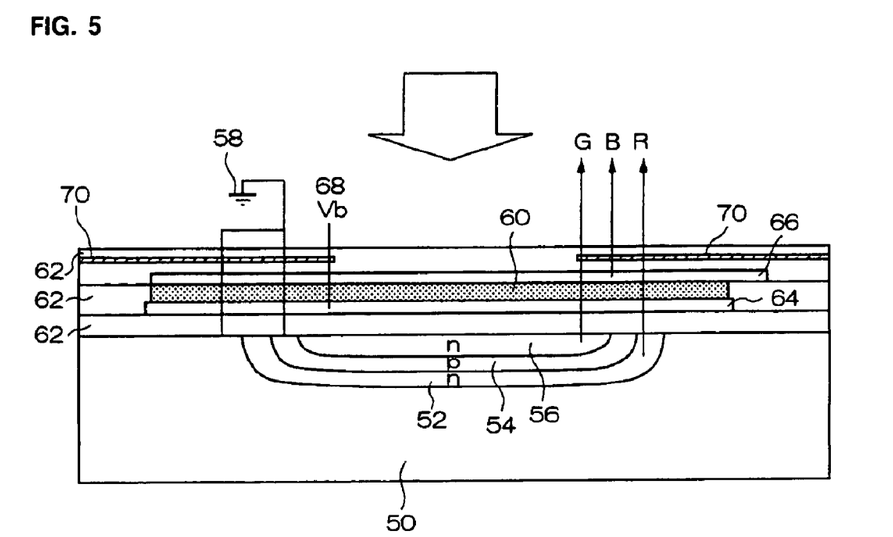
FIG. 5 is a sectional view illustrating the configuration of a first light receiving device.
Figure 6:
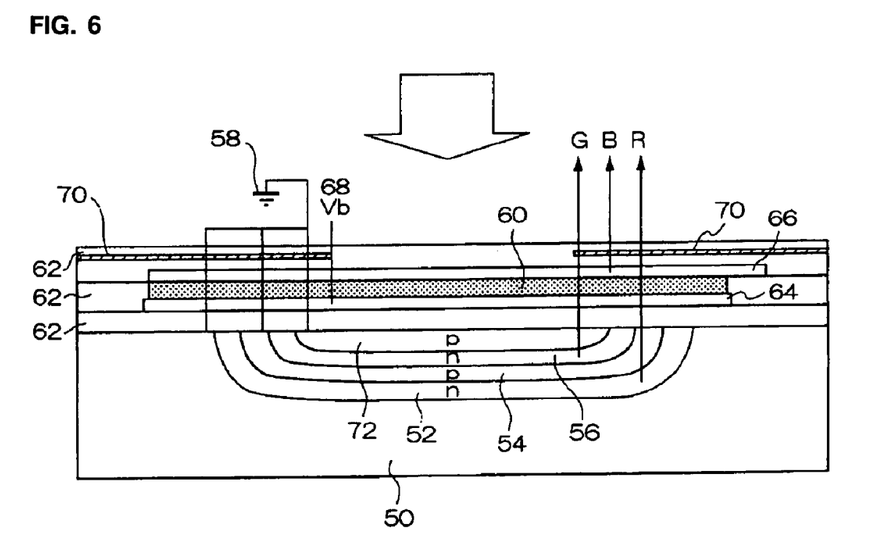
FIG. 6 is a sectional view illustrating the configuration of a second light receiving device.
Figure 7:
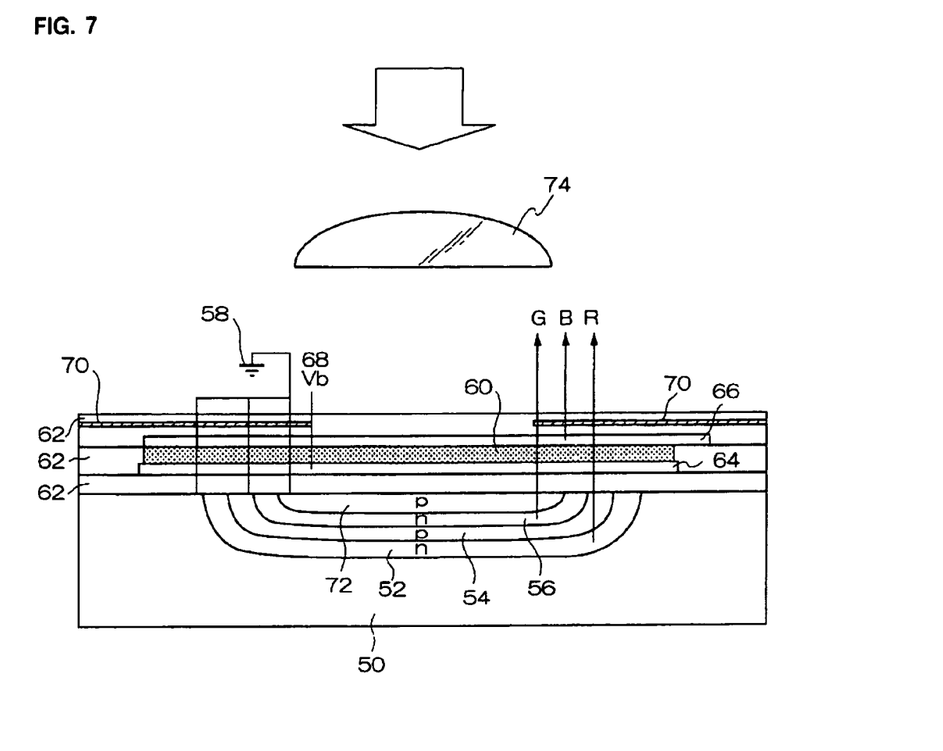
FIG. 7 is a sectional view illustrating the configuration of a third light receiving device.

Hereinafter, preferable embodiments of the light receiving device of the present invention will be described in detail based on the attached drawings. In FIG. 5 to FIG. 7, the arrow indicates the incident light.

1) First Embodiment of a Light Receiving Device

FIG. 5 shows a first embodiment of the light receiving device in which an npn junction diode is formed in the silicon substrate, and a short-wavelength light receiving section is provided outside the silicon substrate on the light entering side.

In the p-type silicon substrate (50), an n-type region (n well) (52), a p-type region (p well) (54), and an n-type region (n well) (56) are formed. From the n-type region (n well) (52) and the n-type region (n well) (56), a red signal and a green signal are outputted, respectively. For the p-type region (p well) (54), an earth (58) is provided.

As the short-wavelength light receiving section (60), any one of those described in the first to fourth embodiments of the short-wavelength light receiving section or the like is appropriately used. The short-wavelength light receiving section (60) is provided outside the above p-type silicon substrate (50), having an npn structure, via an insulating film (62) and a transparent electrode (64).

The short-wavelength light receiving section (60) is disposed between transparent electrodes (64) and (66), the transparent electrode (64) being connected to a bias electrode Vb (68), and from the transparent electrode (66), a blue signal is outputted. To the bias electrode Vb (68), a reverse bias voltage is applied as required.

A light exclusion film (70) is disposed in a location closer to the light-incidence plane than the transparent electrode (66) such that the light exclusion film (70) does not cover the npn junction surface.

2) Second Embodiment of a Light Receiving Device

FIG. 6 shows a second embodiment of the light receiving device in which a pnpn junction diode is formed in the silicon substrate, and a short-wavelength light receiving section is provided outside the silicon substrate on the light entering side.

In the p-type silicon substrate (50), an n-type region (n well) (52), a p-type region (p well) (54), an n-type region (n well) (56), and a p-type region (p well) (72) are formed. Except in that a pnpn junction is formed, this embodiment is similar to the above first embodiment of the light receiving device.

3) Third Embodiment of a Light Receiving Device

FIG. 7 shows an embodiment of the light receiving device in which a micro lens (74) is further provided for the second embodiment of the light receiving device as shown in FIG. 6. Except in that the micro lens (74) is provided, this third embodiment is similar to the above second embodiment of the light receiving device.

(5) Applications

The above-described laminated light receiving device can be utilized not only as an image pickup device by arraying plural thereof, but also as an optical sensor, such as a biosensor or a chemical sensor, and a color light receiving device as a single unit.

Image Pickup Device (1) Outline of an Image Pickup Device of the Present Invention The image pickup device of the present invention includes a plurality of the above-described light receiving devices. By converting the input light into an electric signal, and reading out that signal, image pickup is carried out.

After a certain quantity of electric charge has been accumulated (in the photoelectric conversion mode) by injecting a certain quantity of bias charge into an accumulation diode (in the refresh mode), the signal charge can be read out. The light receiving device itself can also be utilized as an accumulation diode, and an accumulation diode can be separately added.

(2) Method for Signal Reading

A conventionally color read-out circuit can be used for signal reading. Signal charge or signal current, resulting from optical/electric conversion in the light receiving section, is accumulated in the light receiving section itself or an added capacitor. The accumulated electric charge is read out with the selection of the pixel location by the technique for a MOS type image pickup device (so-called CMOS sensor) using an X-Y address method.

Examples of address selection methods further include a method that sequentially selects one pixel at a time with a multiplexer switch and a digital shift register, and reads it out to the common output line as a signal voltage (or charge). The two-dimensionally arrayed X-Y address-based image pickup device is known as a CMOS sensor. In this sensor, a switch provided for a pixel connected to an X-Y intersecting point is connected to a vertical shift register. When the switch is turned on with a voltage from a vertical scanning shift register, the signal, read out from the pixels provided in the same row, is read out to the output line in the row direction. These signals are sequentially read out at the output terminal through a switch driven by a horizontal scanning shift register.

For reading out the output signal, a floating diffusion detector or a floating gate detector can be used. In addition, by providing a signal amplification circuit for the pixel section or using a technique, such as correlated double sampling, a signal-to-noise ratio (S/N) can be improved.

For signal processing, gamma correction by an ADC circuit, digitization by an AD converter, brightness signal processing, or color signal processing can be performed. Examples of color signal processing include white balance processing, color separation processing, color matrix processing, and the like. When the image pickup device of the present invention is used with an NTSC signal, RGB signals can be converted to YIQ signals.

(3) Embodiment of Image Pickup Device

Hereinafter, a preferable embodiment of the image pickup device of the present invention will be described in detail based on an attached drawing.

Figure 8:
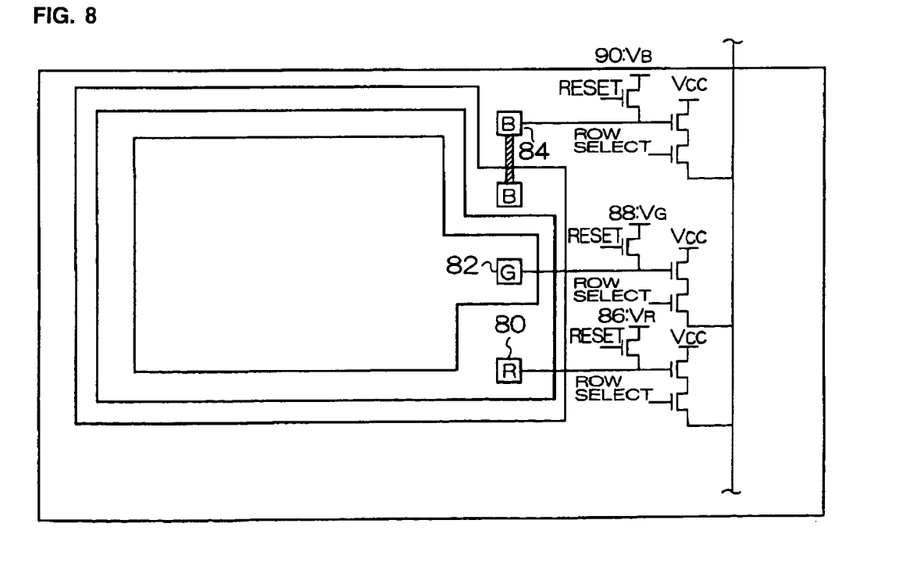
FIG. 8 is a read-out circuit diagram for an image pickup device.
Figures 9, 9A:
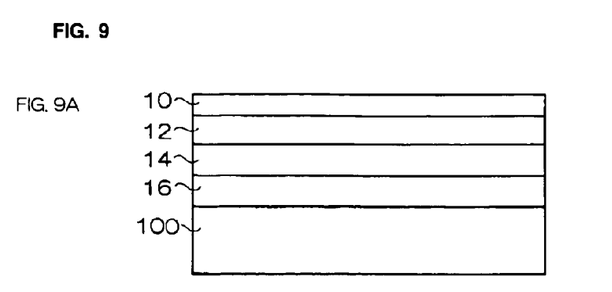
FIGS. 9A-9D are schematic drawings illustrating the production process for the first short-wavelength light receiving section.
Figure 9B:
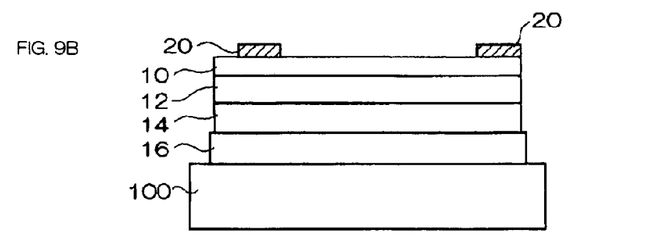
Figure 9C:
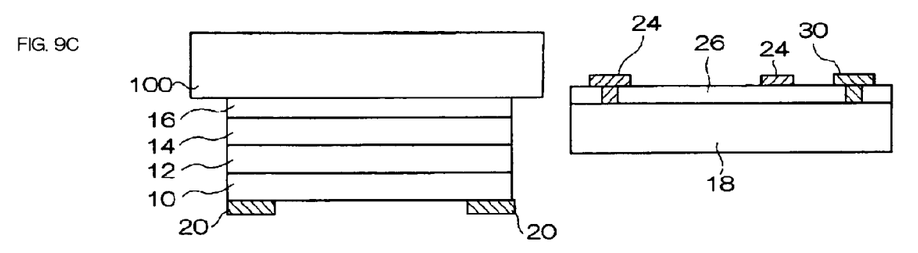
Figure 9D:
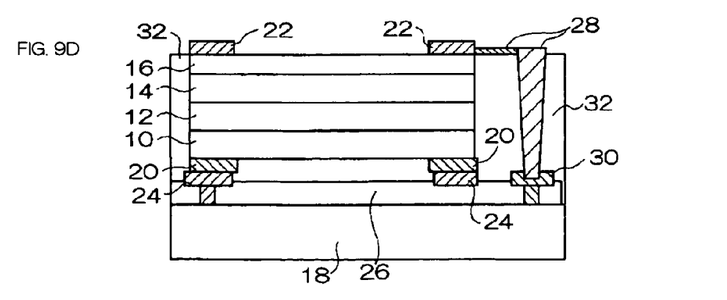
Figures 10, 10A:
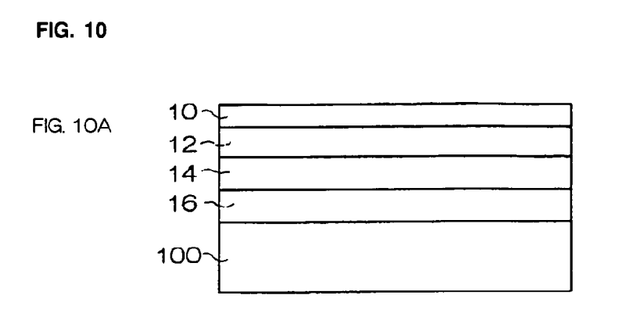
FIGS. 10A-10D are schematic drawings illustrating the production process for the second short-wavelength light receiving section.
Figure 10B:
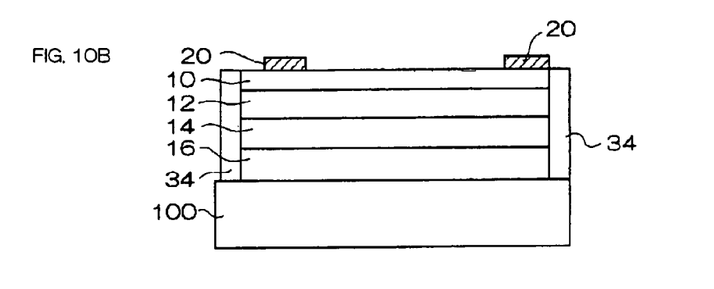
Figure 10C:
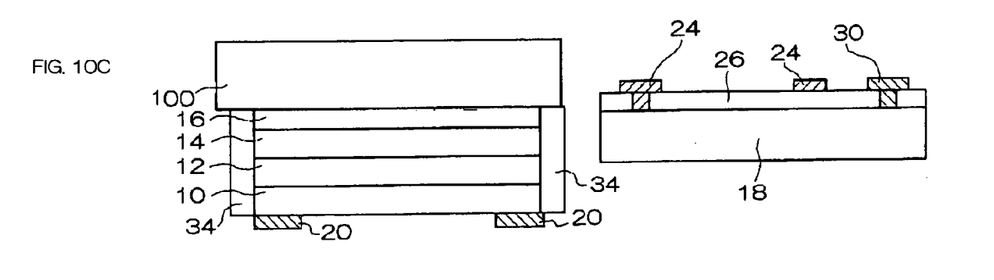
Figure 10D:
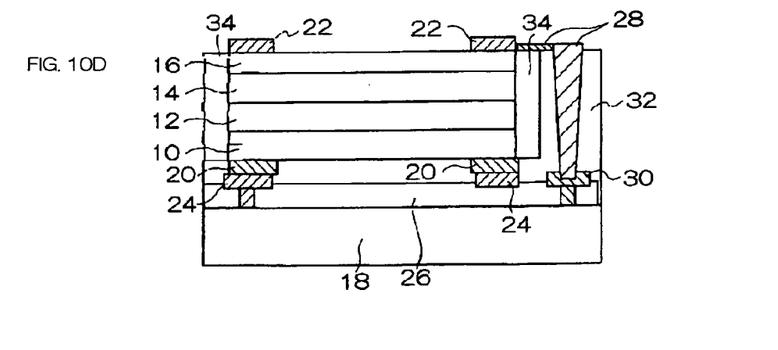
Figures 11, 11A:
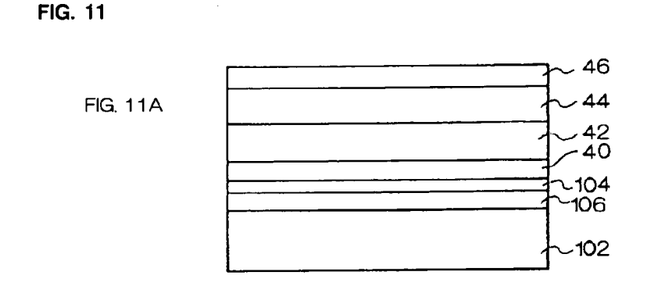
Figure 11B:
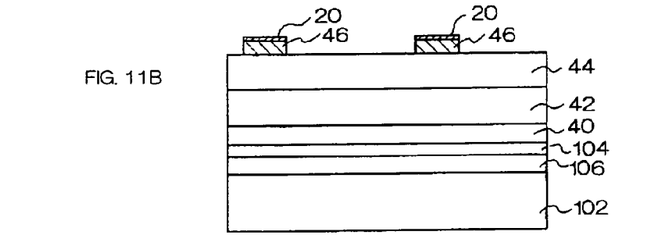
Figure 11C:
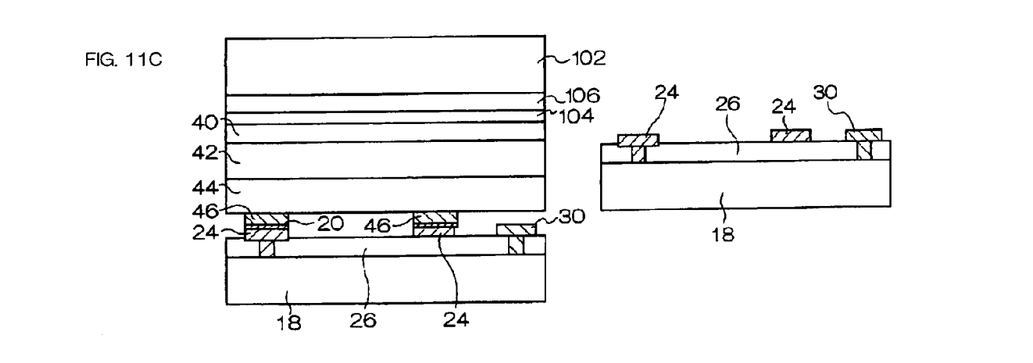
Figure 11D:
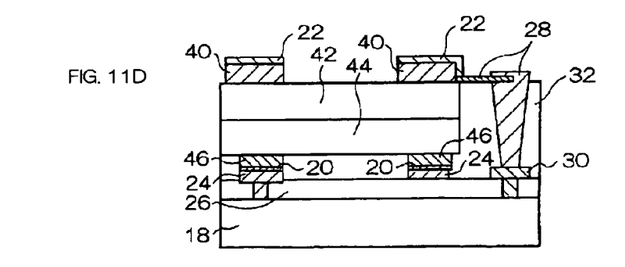
Figures 12, 12A:
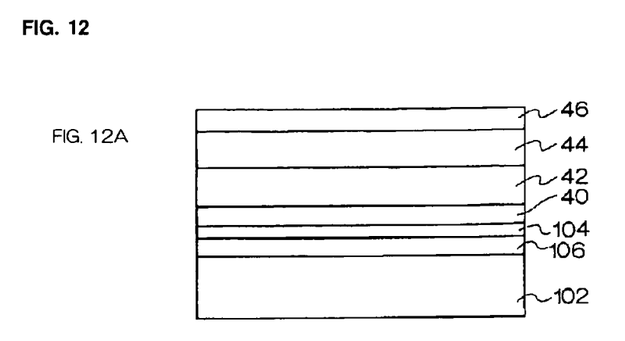
FIGS. 12A-12D are schematic drawings illustrating the production process for the fourth short-wavelength light receiving section.
Figure 12B:
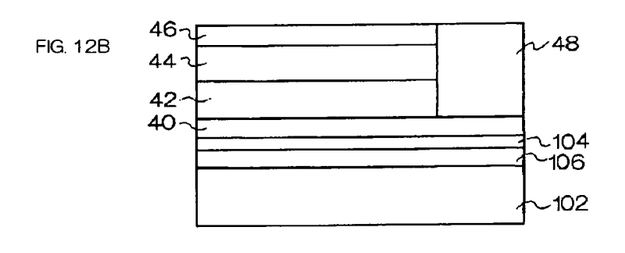
Figure 12C:
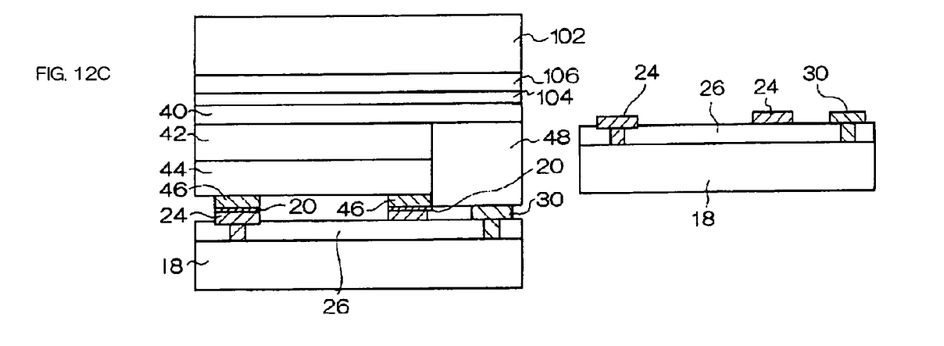
Figure 12D:
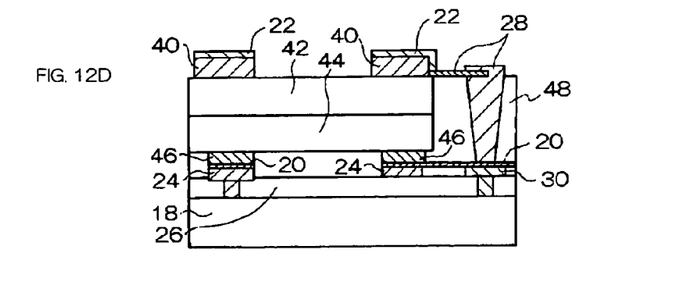

FIG. 8 is a circuit diagram for explaining one pixel as a light receiving device and a circuit for reading it out. The planar structure of the light receiving device is schematically expressed, with an equivalent read out circuit also being shown.

80 indicates a leading electrode for taking out a red signal from the n-type region (n well) (52); 82, a leading electrode for taking out a green signal from the n-type region (n well) (56); and 84, a leading electrode for taking out a blue signal from the electrode (66). These signals are amplification-processed by an amplifying circuit VCC and outputted. The electrodes (80) to (84) are connected to bias voltages $V_R$ (86), $V_G$ (88), $V_B$ (90), respectively, and can be subjected to a reset potential.

EXAMPLES

Hereinafter, the present invention will be described by giving examples. However, the following examples only indicate examples of the light receiving device and the image pickup device according to the present invention, and the applications for the image pickup device and the light receiving device according to the present invention are, of course, not limited to these. On the contrary, components may be further added, depending upon the application. The configuration and manufacturing methods are not particularly limited, if they are included within the above concept.

Example 1

Manufacturing of a Short-Wavelength Light Receiving Section of a First Embodiment FIGS. 9A to D illustrate an outline of the process for manufacturing a short-wavelength light receiving section which essentially consists of an InGaN-based semiconductor.

By using the MOCVD (metallorganic chemical vapor deposition) method, a 2-μm n-GaN contact layer (16), a 0.5-μm n-InGaN layer (14), a 0.5-μm p-InGaN layer (12), and a 0.5-μm p-GaN contact layer (10) were formed on an n-GaN substrate (100). On the surface of the p-GaN contact layer (10), a p-side electrode (20), made of Ni/Au, was formed in the shape of a ring, and element separation was performed. Then, after this subunit was bonded to an Si circuit board (18), the n-GaN substrate was removed.

On the front surface of the n-GaN contact layer (16), an n-side electrode (22) made of Ti/Au was formed. An insulating film (32) was formed between elements; the insulating film was punched by a conventional photolithography method; and wiring (28) was formed between the n-side electrode and the electrode pad (30) on the Si. The p-side provides wiring for applying a common bias voltage to the respective electrodes, and the n-side provides signal extraction wiring.

Manufacturing of a Short-Wavelength Light Receiving Section of a Second Embodiment FIGS. 10A to D illustrates an outline of the process for manufacturing an InGaN light receiving section in which a GaN embedding layer is formed in a circumferential portion of the InGaN light receiving section. This embodiment is similar to the manufacturing process for the first embodiment of the short-wavelength light receiving section, except that an embedding layer (34) was further formed.

The embedding layer was formed by using a method which selectively grows edge surfaces of the short-wavelength light receiving section, using an oxide film as a mask. The thickness of the GaN layer formed around the edges of the short-wavelength light receiving section was 0.2 μm.

Manufacturing of a Short-Wavelength Light Receiving Section of a Third Embodiment FIGS. 11A to D illustrates an outline of the process for manufacturing a short-wavelength light receiving section with an InAlP semiconductor which is lattice matched to the GaAs.

By using the MOCVD (metallorganic chemical vapor deposition) method, an n-GaAs contact layer (106), an n-InGaP etching inhibition layer (104), a 1 μm n-GaAs contact layer (40), a 0.5-μm n-InAlP layer (42), a 0.5-μm p-InAlP layer (44), and a 0.2-μm p-GaAs contact layer (46) were formed on an n-GaAs substrate (102). Then, the p-GaAs contact layer (46) was processed into a predetermined form by a conventional dry etching method, and on the surface thereof, a p-side electrode (20), which is made of Ti/Pt/Au and has a ring shape, was formed. The p-side electrode was joined to a solder joint formed on an Si circuit board, and the short-wavelength light receiving section was aligned with the silicon light receiving section (18). The n-GaAs substrate, the n-GaAs layer, and the n-InGaP etching inhibition layer were removed by a dry etching method, which was followed by processing the n-GaAs contact layer (40) to a predetermined form. On the surface of the n-GaAs contact layer processed to the predetermined form, a ring-shaped n-side electrode (22) made of AuGe/Ni/Au was formed and connected to the Si circuit.

Manufacturing of a Short-Wavelength Light Receiving Section of a Fourth Embodiment FIGS. 12A to D illustrates an outline of the process for manufacturing a short-wavelength light receiving section in which an InAlP embedding layer (48) is formed in the above short-wavelength light receiving section of the third embodiment. The embedding method is similar to that used in manufacturing the above short-wavelength light receiving section of the second embodiment.

Manufacturing of a Short-Wavelength Light Receiving Section of a Fifth Embodiment A short-wavelength light receiving section was manufactured by using an organic material.

As a blue color absorption coloring dye, coumarin 6 was used. Coumarin 6 was dispersed in polysilane, which is a transparent conductive polymer, and a coumarin 6/polysilane film was formed on a glass substrate with ITO electrodes to a film thickness of 1.0 μm by the rotation coating method. On the coumarin 6/polysilane film, semi-transparent aluminum electrodes having a thickness of 50 nm were formed.

Manufacturing of a Light Receiving Device of a First Embodiment

In a silicon substrate, p-type regions of a first conductivity type and n-type regions of a second conductivity type, which is opposite to the first conductivity type, were alternately multiple laminated from the light entering side to form an npn junction diode. The depths of the respective pn junctions were 0.25 μm and 2.3 μm. Signal output was performed from the n-type region. An earth was disposed from the p-type region.

As the short-wavelength light receiving section, any one of the above first to fifth embodiments of the short-wavelength light receiving sections was appropriately used.

In a location closer to the incidence plane with respect to the short-wavelength light receiving section, a light exclusion film was disposed so as not to cover the npn junction surface.

When any one of the first to fifth short-wavelength light receiving sections was disposed outside the silicon substrate, the blue signal had minimal noise.

Example 2

Manufacturing of a Light Receiving Device of a Second Embodiment

A light receiving device of the second embodiment was manufactured in the same manner as the light receiving device of the first embodiment, except in that a pnpn junction diode was formed instead of the npn junction diode.

The depths of the respective pn junctions were 0.1 μm, 0.3 μm, and 2.5 μm.

Even with the light receiving device which was thus provided with the pnpn junction diode in the silicon substrate, the blue signal had minimal noise, since the short-wavelength light receiving section was provided outside the silicon substrate.

What is claimed is:

1. A light receiving device comprising a semiconductor substrate and a short-wavelength light receiving section provided on or above a surface of a light entering side of the semiconductor substrate, wherein:
   the semiconductor substrate comprises regions of a first conductivity type and regions of a second conductivity type in an alternately multiply laminated manner, wherein the second conductivity type is a conductivity type opposite to the first conductivity type;
   each of junction surfaces between the regions of the first conductivity type and the regions of the second conductivity type is formed to have a depth which enables converting light in a wavelength band, which is different from light in other wavelength band(s) converted by other junction surfaces, to electricity; and
   the short-wavelength light receiving section is separated from the semiconductor substrate by at least an insulating layer and detects light having a wavelength shorter than the central wavelength(s) of all the respective wavelength bands converted by the junction surfaces.

2. The light receiving device of claim 1, wherein the semiconductor substrate and the short-wavelength light receiving section are spaced apart from each other.

3. The light receiving device of claim 1, wherein a junction surface which has a light receiving section which mainly receives green color light resides nearer to the light entering side of the semiconductor substrate than a junction surface which has a light receiving section which mainly receives red color light.

4. The light receiving device of claim 1, wherein the semiconductor substrate is a p-type silicon substrate, and has a structure selected from the group consisting of an npn junction and a pnpn junction, in which the p-n order is listed from the light entering side of the silicon substrate.

5. The light receiving device of claim 1, wherein the short-wavelength light receiving section is made of an inorganic semiconductor, and the band gap is in a range of 420 to 480 nm.

6. The light receiving device of claim 5, wherein the short-wavelength light receiving section is made of an InGaN-based, InAlN-based, InAlP-based, or InGaAlP-based inorganic semiconductor.

7. The light receiving device of claim 1, wherein a quantum efficiency curve for the short-wavelength light receiving section has a maximum value in a frequency range of 420 to 480 nm.

8. The light receiving device of claim 1, wherein the short-wavelength light receiving section is embedded in a semiconductor having a band gap wavelength which is equivalent to or shorter than a band gap wavelength of the short-wavelength light receiving section.

9. The light receiving device of claim 4, wherein the short-wavelength light receiving section is made of an InGaN-based, or InAlN-based, inorganic semiconductor formed on a GaN layer.

10. The light receiving device of claim 9, wherein the short-wavelength light receiving section is embedded in a GaN embedding layer which is formed around the light receiving section.

11. The light receiving device of claim 4, wherein the short-wavelength light receiving section is made of an InAlP-based, or InGaAlP-based, inorganic semiconductor formed on a GaAs layer.

12. The light receiving device of claim 11, wherein the short-wavelength light receiving section is embedded in an InAlP embedding layer which is formed around the light receiving section.

13. An image pickup device in which a plurality of light receiving devices are arranged, wherein the light receiving device comprise a semiconductor substrate and a short-wavelength light receiving section provided on or above a surface of a light entering side of the semiconductor substrate, wherein:
   the semiconductor substrate comprises regions of a first conductivity type and regions of a second conductivity type in an alternately multiply laminated manner, wherein the second conductivity type is a conductivity type opposite to the first conductivity type;
   each of junction surfaces between the regions of the first conductivity type and the regions of the second conductivity type is formed to have a depth which enables converting light in a wavelength band, which is different from light in other wavelength band(s) converted by other junction surfaces, to electricity; and
   the shortwavelength light receiving section is separated from the semiconductor device by at least an insulating layer and detects light having a wavelength shorter than the central wavelength(s) of all the respective wavelength band(s) converted by the junction surfaces.

14. The image pickup device of claim 13, which is used as a CMOS image sensor.

* * * * *